United States Patent
Chang et al.

(10) Patent No.: US 8,772,833 B2
(45) Date of Patent: Jul. 8, 2014

(54) POWER SEMICONDUCTOR DEVICE AND FABRICATION METHOD THEREOF

(75) Inventors: Woo Jin Chang, Daejeon (KR); Jong Won Lim, Daejeon (KR); Ho Kyun Ahn, Daejeon (KR); Sang Choon Ko, Daejeon (KR); Sung Bum Bae, Daejeon (KR); Chull Won Ju, Daejeon (KR); Young Rak Park, Daejeon (KR); Jae Kyoung Mun, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/592,560

(22) Filed: Aug. 23, 2012

(65) Prior Publication Data

US 2013/0069173 A1    Mar. 21, 2013

(30) Foreign Application Priority Data

Sep. 21, 2011  (KR) .................. 10-2011-0095274
Jul. 17, 2012  (KR) .................. 10-2012-0077726

(51) Int. Cl.
    *H01L 29/15*  (2006.01)
(52) U.S. Cl.
    USPC ........... 257/194; 257/280; 257/355; 257/409; 257/488
(58) Field of Classification Search
    USPC .................... 257/194, 280, 355, 409, 488
    See application file for complete search history.

(56) References Cited

U.S. PATENT DOCUMENTS

| 7,550,783 | B2* | 6/2009 | Wu et al. ............... 257/194 |
| 7,573,078 | B2* | 8/2009 | Wu et al. ............... 257/194 |
| 7,732,837 | B2* | 6/2010 | Saito et al. ............ 257/195 |
| 7,800,131 | B2* | 9/2010 | Miyamoto et al. ..... 257/192 |
| 7,851,825 | B2* | 12/2010 | Suh et al. ............. 257/194 |
| 7,893,500 | B2 | 2/2011 | Wu et al. |
| 8,120,066 | B2* | 2/2012 | Lanzieri et al. ........ 257/194 |
| 8,148,752 | B2* | 4/2012 | Ikoshi et al. .......... 257/194 |
| 8,253,169 | B2* | 8/2012 | Kawasaki ............. 257/194 |

(Continued)

FOREIGN PATENT DOCUMENTS

KR    10-2007-0092482 A    9/2007
KR       10-0782430 B1    11/2007

OTHER PUBLICATIONS

Ando et al. "Novel AlGaN/GaN Dual-Field-Plate FET With High Gain, Increased Linearity and Stability" Electron Devices Meeting, IEDM Technical Digest, IEEE International Dec. 5, 2005.*

(Continued)

Primary Examiner — Michael Shingleton
(74) Attorney, Agent, or Firm — Rabin & Berdo, P.C.

(57) ABSTRACT

Disclosed are a power semiconductor device and a method of fabricating the same which can increase a breakdown voltage of the device through a field plate formed between a gate electrode and a drain electrode and achieve an easier manufacturing process at the same time. The power semiconductor device according to an exemplary embodiment of the present disclosure includes a source electrode and a drain electrode formed on a substrate; a dielectric layer formed between the source electrode and the drain electrode to have a lower height than heights of the two electrodes and including an etched part exposing the substrate; a gate electrode formed on the etched part; a field plate formed on the dielectric layer between the gate electrode and the drain electrode; and a metal configured to connect the field plate and the source electrode.

10 Claims, 8 Drawing Sheets

(56) References Cited

U.S. PATENT DOCUMENTS

| | | | |
|---|---|---|---|
| 2005/0253168 A1 | 11/2005 | Wu et al. | |
| 2008/0128752 A1* | 6/2008 | Wu | 257/194 |
| 2009/0224288 A1* | 9/2009 | Parikh et al. | 257/194 |
| 2011/0089468 A1* | 4/2011 | Zhang | 257/194 |
| 2011/0169054 A1* | 7/2011 | Wu et al. | 257/194 |
| 2012/0049243 A1* | 3/2012 | Wu | 257/194 |
| 2012/0211800 A1* | 8/2012 | Boutros | 257/194 |
| 2012/0217544 A1* | 8/2012 | Ohki | 257/194 |
| 2012/0223366 A1* | 9/2012 | Wu et al. | 257/194 |
| 2012/0235160 A1* | 9/2012 | Heikman et al. | 257/76 |
| 2012/0305936 A1* | 12/2012 | Yamaki | 257/76 |

OTHER PUBLICATIONS

Chiu et al. "Power and linearity comparisons of gate- and sourece-terminated field-plate pseudomorphic HEMTs" Institute of Physics Publishing Semiconductor science and technology 20(2005) pp. 1183-1186.*

Saito et al. "Design and Demonstration of High Breakdown Voltage GaN High Electron Mobility Transistor (HEMT) Using Field Plate Structure for Power Electronics Applications", Japanese Journel of Applied Physics vol. 43, No. 4B, 2004 pp. 2239-2242.*

Saito et al. Recessed-Gate Structure Approach Toward Normally Off High-Voltage AlGaN/GaN HEMT for Power Electronics Applications, IEEE transactions on electronic devices, vol. 53, No. 2 Feb. 2006 pp. 356-362.*

Y.F. Wu et al., "30-W/mm GaN HEMTs by Field Plate Optimization", IEEE Electron Device Letters, Mar. 2004, pp. 117-119, vol. 25, No. 3.

Wataru Saito et al., "High Breakdown Voltage AlGaN—GaN Power-HEMT Design and High Current Density Switching Behavior", IEEE Transactions on Electron Devices, Dec. 2003, pp. 2528-2531, vol. 50, No. 12.

* cited by examiner

POWER SEMICONDUCTOR DEVICE AND FABRICATION METHOD THEREOF

CROSS-REFERENCE TO RELATED APPLICATIONS

This application is based on and claims priority from Korean Patent Application No. 10-2011-0095274, filed on Sep. 21, 2011, and Korean Patent Application No. 10-2012-0077726, filed on Jul. 17, 2012, with the Korean Intellectual Property Office, the disclosure of which is incorporated herein in its entirety by reference.

TECHNICAL FIELD

The present disclosure relates to a power semiconductor device capable of increasing a breakdown voltage by using a field plate and a method of fabricating the same.

BACKGROUND

Power semiconductor devices are used in an electronic device of a vehicle and various types of electronic devices requiring high voltage and power, and these devices are required to have higher breakdown voltages and lower on-resistance characteristics. In a case of a power semiconductor device using a currently developed GaN technology, it is possible to implement a higher breakdown voltage and a lower on-resistance characteristic in comparison with a silicon technology in the related art, so that a demand for the power semiconductor device is significantly increasing.

A measurement of the breakdown voltage is performed through a method of completely blocking a channel between a drain and a source due to a depletion region by applying a sufficiently lower voltage than a threshold voltage to a gate terminal so that a current does not flow in the channel and then gradually applying high voltages to a drain terminal. When the voltage applied to the drain terminal is gradually increased, the depletion region of the channel gradually becomes narrow and thus the current flowing in the channel increases. In this case, the drain voltage is measured, and an external driving limit bias is evaluated.

In this case, due to a difference between a high voltage applied to the drain terminal and a voltage of a gate terminal located adjacent to the drain terminal, a high electric field is formed between the drain and gate terminals, but such a high electric field should be restricted to obtain a higher breakdown voltage. To this end, a research on a scheme for reducing an intensity of the electric field by using a structure such as a field plate has been made, and a source connection type field plate structure, a gate connection type field plate structure, a drain connection type field plate structure and the like have been developed.

FIGS. 1A and 1B illustrate an example of a GaN power semiconductor device in the related art. FIG. 1A is a cross-sectional view of the device, and FIG. 1B is a plan view of the device.

Referring to FIGS. 1A and 1B, a GaN power semiconductor device 100 in the related art includes a source electrode 103, a drain electrode 105 and a gate electrode 107 formed on a substrate 101 including an AlGaN/GaN epi layer, a field plate 111 formed on an insulating layer 109 and a field plate 115 formed on an insulating layer 113. The field plate 111 and the source electrode 103 are connected by a metal 117, and particularly, both end parts of the field plate 111 and the source electrode 103 are connected by another metal 121. The field plate 115 and the source electrode 103 are connected by a metal 119.

Through such use of a structure, it is possible to obtain an effect of reducing an intensity of an electric field between the drain electrode 105 and the gate electrode 107, but a photomask is additionally required since a process step for forming the field plates 111 and 113 is added and a problem of deteriorating a total yield and reliability of the device due to a complex structure may occur. Further, when the gate electrode 107 is manufactured in a gamma (Γ) shape or a T shape in order to reduce the intensity of the electric field, the structure becomes more complex.

FIG. 2 illustrates another example of a power semiconductor device in the related art.

Referring to FIG. 2, a GaN power semiconductor device 200 in the related art includes a source electrode 203 and a drain electrode 205 formed on a Si substrate 201 including an AlGaN/GaN epi layer, a gate electrode 209 including a gate connection type field plate manufactured in the gamma type, a dielectric layer 207 such as SiN, a source connection type field plate 213 and a metal 211 for connecting the source connection type field plate 213 with the source electrode 203.

The Si substrate 201 includes the AlGaN/GaN epi layer, and a compound ratio, widths and the like of AlGaN and GaN are determined by a separate design. The electrodes 203, 205, and 209 are formed of a metal, and a process is implemented such that the source electrode 203 and the drain electrode 205 have an ohmic contact and the gate electrode 209 has a Schottky contact. Contact configurations of the electrodes by this process generally corresponds to well known types. In a general process order, an active area is first defined, the source electrode 203 and the drain electrode 205 are formed to have the ohmic contact, the dielectric layer 207 such as SiN is formed, and the gate electrode 209 is formed by etching only the dielectric layer located in a part on which the gate electrode 209 is to be formed. Subsequently, the metal 211 is formed on the source electrode 203, and then the source connection type field plate 213 is formed.

In FIG. 2, curves indicated by arrows represent an intensity of an electric field generated between the drain electrode 205, gate electrode 209 and the field plate 213. As described above, it is possible to obtain an effect of partly reducing the intensity of the electric field between the drain electrode 205 and the gate electrode 209 by causing a part of the electric field to be formed on the gate electrode 209 to be formed on the field plate 213 through the field plate structure in the related art. However, an effect of improving the breakdown voltage of the power semiconductor device through the field plate structure in the related art is not so great.

SUMMARY

The present disclosure has been made in an effort to provide a power semiconductor device capable of increasing a breakdown voltage of the device through a field plate formed between a gate electrode and a drain electrode and allowing an easier manufacturing process at the same time, and a method of fabricating the same.

An exemplary embodiment of the present disclosure provides a power semiconductor device including a source electrode and a drain electrode formed on a substrate; a dielectric layer formed between the source electrode and the drain electrode to have a lower height than heights of the two electrodes and including an etched part exposing the substrate; a gate electrode formed on the etched part; a field plate formed on the dielectric layer between the gate electrode and the drain electrode; and a metal configured to connect the field plate and the source electrode.

Another exemplary embodiment of the present disclosure provides a method of fabricating a power semiconductor device including forming a source electrode and a drain electrode on a substrate; forming a dielectric layer between the source electrode and the drain electrode; etching a part of the dielectric layer to form an etched part; simultaneously forming a gate electrode on the etched part and a field plate on the dielectric layer between the etched part and the drain electrode; and forming a metal configured to connect the field plate and the source electrode on an equal plan on which the field plate is formed.

Yet another exemplary embodiment of the present disclosure provides a power semiconductor device including a source electrode and a drain electrode formed on a substrate; a dielectric layer formed between the source electrode and the drain electrode to have a lower height than heights of the two electrodes and including an etched part exposing the substrate; a gate electrode formed on the etched part; a first field plate formed on the dielectric layer between the gate electrode and the drain electrode; a second field plate spaced from the gate electrode and formed over an area from the source electrode to the first field plate; and a metal configured to connect the source electrode and the second field plate, and the first field plate and the second field plate, respectively.

Yet still another exemplary embodiment of the present disclosure provides a method of fabricating a power semiconductor device including forming a source electrode and a drain electrode on a substrate; forming a dielectric layer between the source electrode and the drain electrode; etching a part of the dielectric layer to form an etched part; simultaneously forming a gate electrode on the etched part and a first field plate on the dielectric layer between the etched part and the drain electrode; forming a metal on the source electrode and the first field plate; and forming a second field plate on the metal to be spaced apart from the gate electrode.

According to the exemplary embodiments of the present disclosure, it is possible to increase a breakdown voltage of a power semiconductor device by forming a field plate between a gate electrode and a drain electrode, and to achieve an easier manufacturing process by simultaneously forming the gate electrode and the field plate in a fabricating process.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 3A:
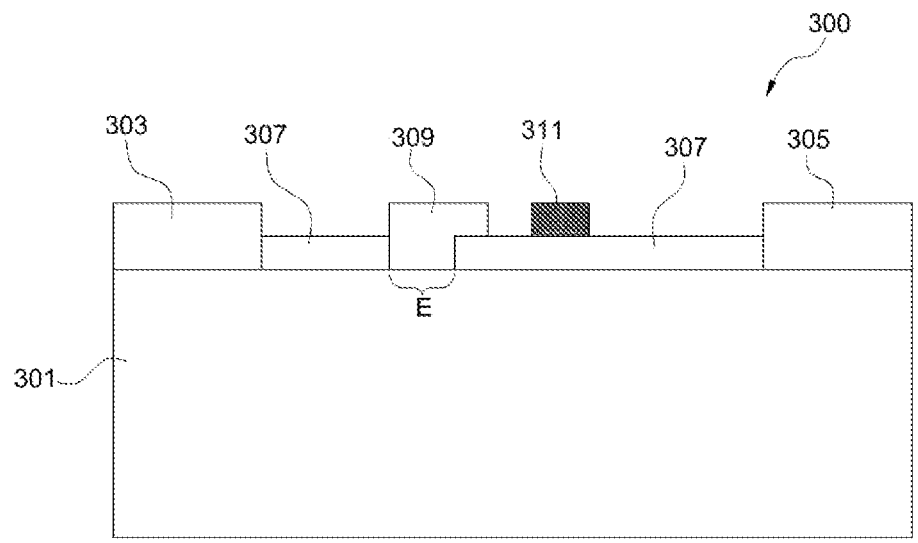
FIGS. 3A to 3C are configuration diagrams of a power semiconductor device according to a first exemplary embodiment of the present disclosure.
Figure 3B:
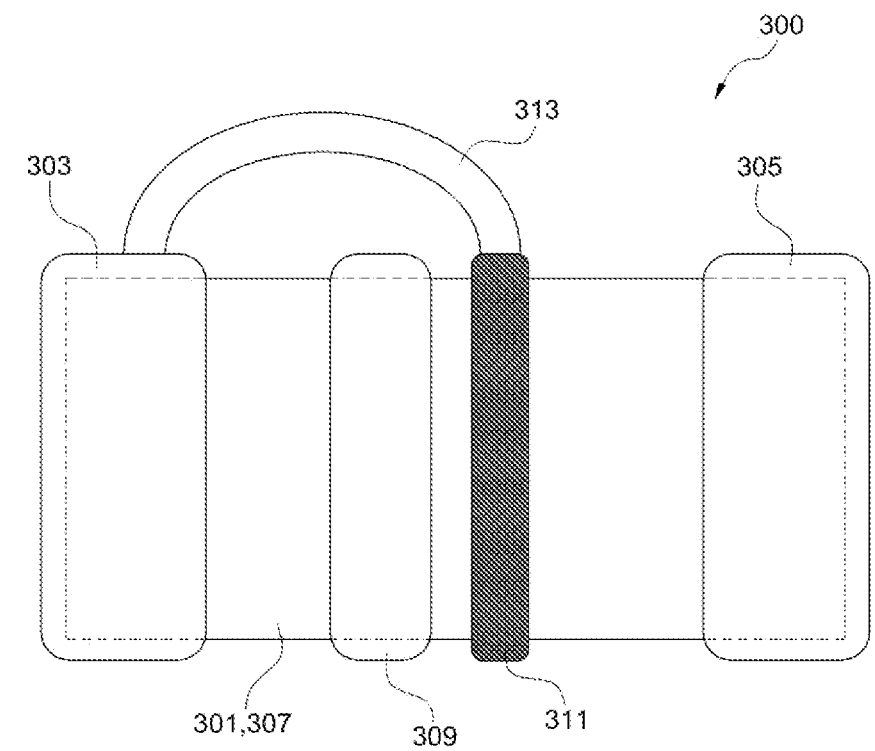
Figure 3C:
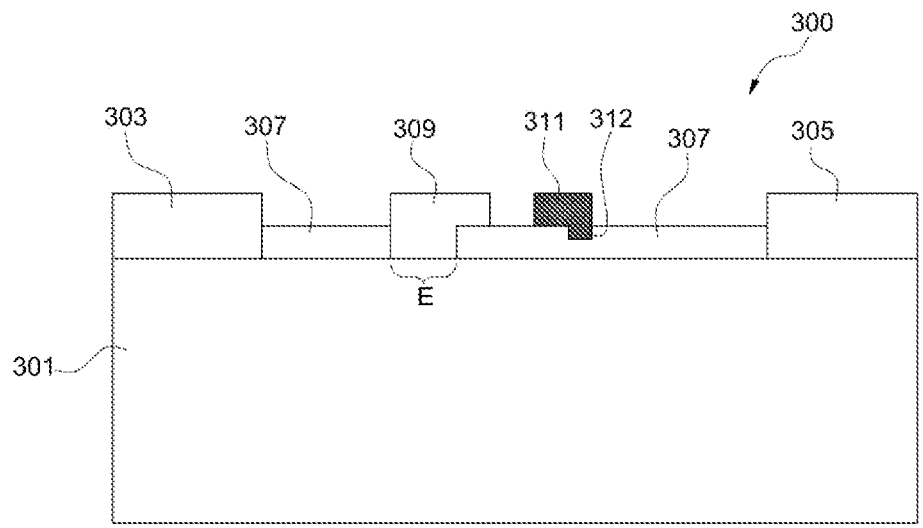

FIGS. 3A to 3C are configuration diagrams of a power semiconductor device according to a first exemplary embodiment of the present disclosure. FIGS. 3A and 3C are cross-sectional views of the device, and FIG. 3B is a plan view of the device.

Referring to FIGS. 3A and 3B, a power semiconductor device 300 according to a first exemplary embodiment of the present disclosure includes a source electrode 303 and a drain electrode 305 formed on a substrate 301, a dielectric layer 307 formed between the source electrode 303 and the drain electrode 305 to have a lower height than heights of the two electrodes and including an etched part (E) exposing the substrate 301, a gate electrode 309 formed on the etched part (E), a field plate 311 formed on the dielectric layer 307 between a gate electrode 309 and the drain electrode 305 and a metal 333 for connecting the field plate 311 and the source electrode 303.

The substrate 301 includes a buffer layer, an AlGaN/GaN epi layer and the like, and a compound ratio, widths and the like of AlGaN and GaN are determined by a separate design but the present disclosure does not limit them in particular.

The electrodes 303, 305, and 309 are formed of a metal, and it is configured such that the source electrode 303 and the drain electrode 305 have an ohmic contact and the gate electrode 309 has a Schottky contact. Contact configurations of the electrodes by the process generally correspond to well known types.

The metal 313 is connected to both end parts of the field plate 311 and the source electrode 303, and it is preferable that the metal 313 is formed on the same plan as the field plate 311. The metal 313 may have a curve shape as shown in FIG. 3B, but the metal 313 is not limited to such a shape. When the metal 313 is implemented in the curve shape, an effect of further reducing an electric field concentration phenomenon of the gate electrode 309 is generated.

The gate electrode 309 may be formed in a gamma (Γ) shape or a T shape. Further, it is possible to reduce the electric field concentration phenomenon by forming corner parts of the electrodes 303, 305 and 309 and the field plate 311 in a curve shape.

In a fabricating process of the power semiconductor device 300, an active area is first defined, and the source electrode 303 and the drain electrode 305 are formed on the substrate 301 to have the ohmic contact. Subsequently, the dielectric layer 307 such as SiN is formed, and a part (E) on which the gate electrode 309 is to be formed is etched using a photomask and the like. Subsequently, the gate electrode 309 and the field plate 311 are simultaneously formed, and the metal 313 for connecting both end parts of the source electrode 303 and the field plate 311 is formed.

As describe above, the present disclosure can simultaneously form the field plate 311 during a step of forming the gate electrode 309, so that it is possible to achieve the fabrication with a simple procedure without the additional photomask and process step for forming the field plate 311 in the related art.

Meanwhile, the present exemplary embodiment can further form a fine field plate 312 through a fine etching process and metal plating on the dielectric layer 307 as shown in FIG. 3C. In this case, a structure such as a lightning rod is formed below the field plate 311 by the fine field plate 312, and thus the effects of further mitigating the electric field concentration phenomenon on the gate electrode 309 and improving the breakdown voltage are obtained.

Figure 4A:
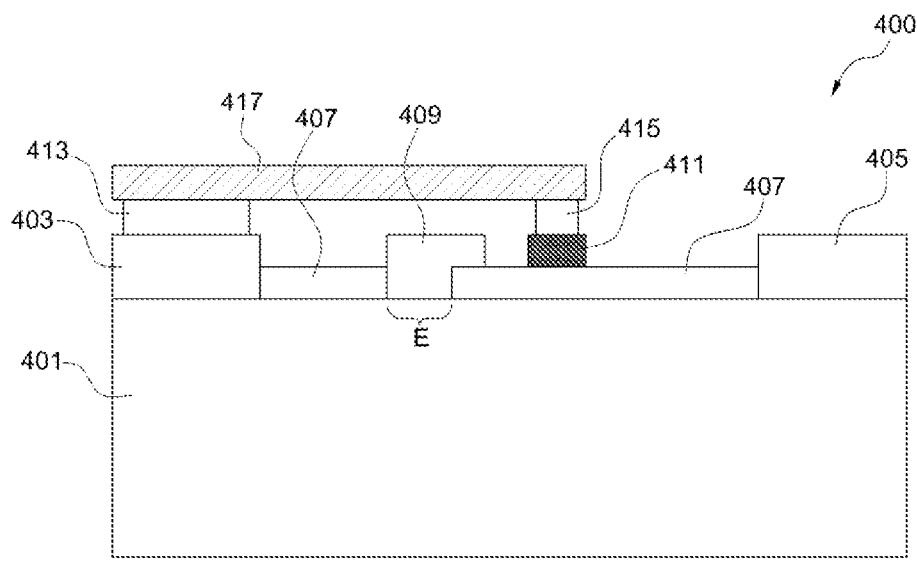
FIGS. 4A to 4C are configuration diagrams of a power semiconductor device according to a second exemplary embodiment of the present disclosure.
Figure 4B:
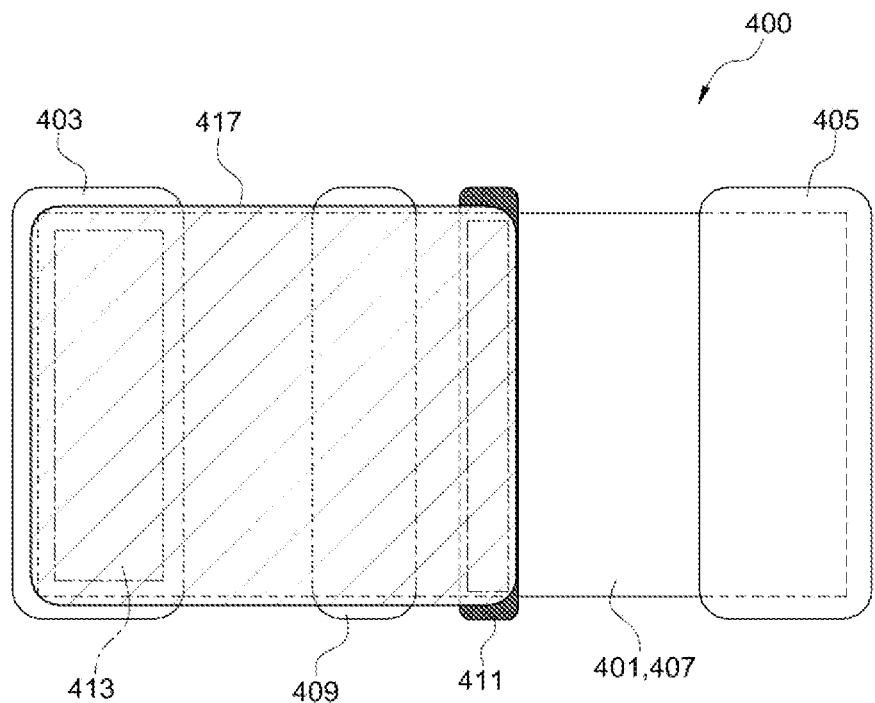
Figure 4C:
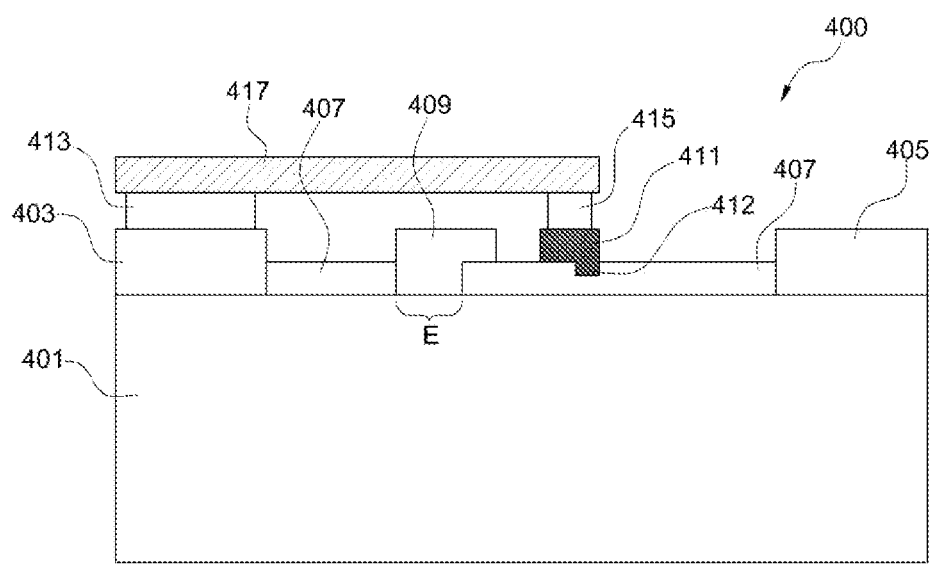

FIGS. 4A to 4C are configuration diagrams of a power semiconductor device according to a second exemplary embodiment of the present disclosure. FIGS. 4A and 4C are cross-sectional views of the device, and FIG. 4B is a plan view of the device.

Referring to FIGS. 4A and 4B, a power semiconductor device 400 according to a second exemplary embodiment of the present disclosure includes a source electrode 403 and a drain electrode 405 formed on a substrate 401, a dielectric layer 407 formed between the source electrode 403 and the drain electrode 405 to have a lower height than heights of the two electrodes and including an etched part (E) exposing the substrate, a gate electrode 409 formed on the etched part (E), a first field plate 411 formed on the dielectric layer 407 between the gate electrode 409 and the drain electrode 405, a second field plate 417 spaced from the gate electrode 409 and formed over an area from the source electrode 403 to the first field plate 411 and metals 413 and 415 for connecting the source electrode 403 and the second field plate 417, and the first field plate 411 and the second field plate 417, respectively.

The substrate 401 includes a buffer layer, an AlGaN/GaN epi and the like, and a compound ratio, widths and the like of AlGaN and GaN are determined by a separate design but the present disclosure does not limit them in particular.

The electrodes 403, 405, and 409 are formed of a metal, and it is configured such that the source electrode 403 and the drain electrode 405 have an ohmic contact and the gate electrode 409 has a Schottky contact. Contact configurations of the electrodes by the process generally correspond to well known types.

The present exemplary embodiment forms the field plates 411 and 417 having a dual structure, so that it is possible to further reduce an intensity of the electric field and increase the breakdown voltage. However, in order to implement such a structure, the first field plate 411 should have a size sufficient to enable a process of forming a metal 415 for connecting the first field plate 411 and the second field plate 417.

The gate electrode 409 may be formed in a gamma (Γ) shape or a T shape, and it is possible to further reduce the electric field concentration phenomenon by forming corner parts of the electrodes 403, 405 and 409 and the field plates 411 and 417.

In a fabricating process of the power semiconductor device 400, an active area is first defined, and the source electrode 403 and the drain electrode 405 are formed on the substrate 401 to have the ohmic contact. Subsequently, the dielectric layer 407 such as SiN is formed, and a part (E) on which the gate electrode 409 is to be formed is etched using a photomask and the like. Subsequently, the gate electrode 409 and the field plate 411 are simultaneously formed. Subsequently, the metals 413 and 415 are formed on the source electrode 403 and the first field plate 411, and the second field plate 417 is formed.

Meanwhile, the present exemplary embodiment can further form a fine field plate 412 through a fine etching process and metal plating on the dielectric layer 407 as shown in FIG. 4C. In this case, a structure such as a lightning rod is formed below the field plate 411 by the fine field plate 412, and thus effects of further mitigating the electric field concentration phenomenon on the gate electrode 409 and improving the breakdown voltage are obtained.

Figure 5:
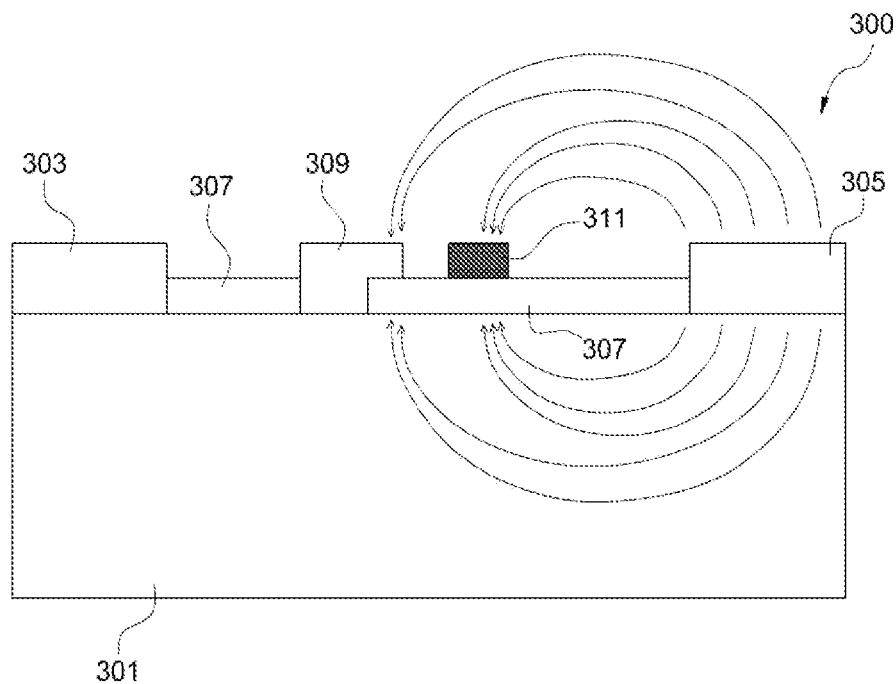
FIGS. 5 and 6 are diagrams for describing a reduction effect of an electric field concentration phenomenon according to the present disclosure.
Figure 6:
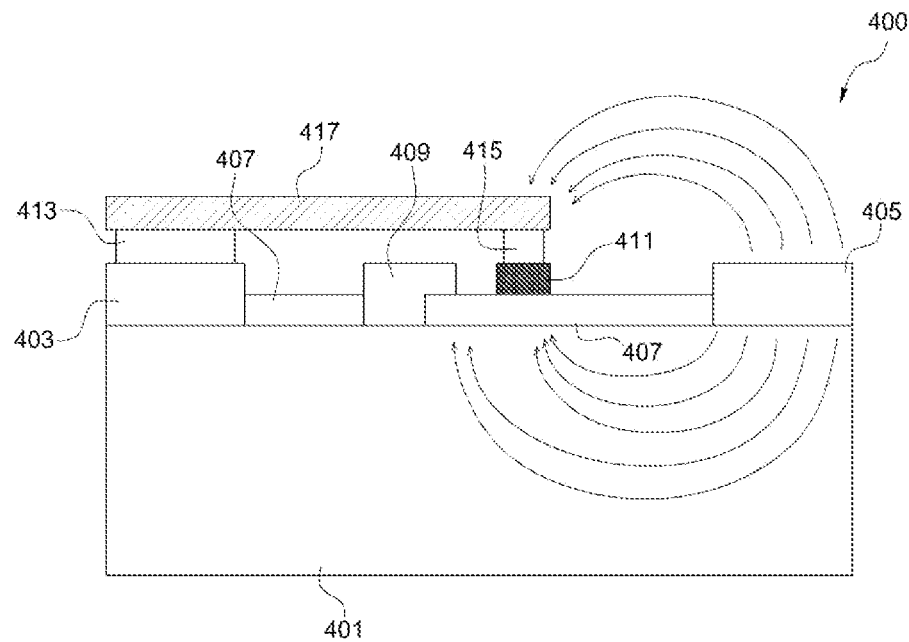
Figure 7:
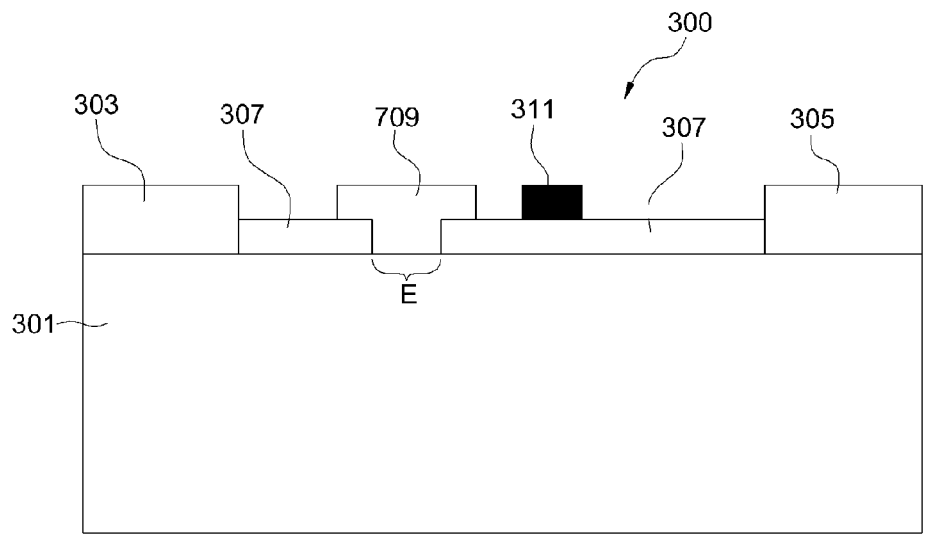
FIG. 7 is a configuration diagram of a power semiconductor device is identical to FIG. 3A except that the gate electrode 709 has a T shape.
Figure 8:
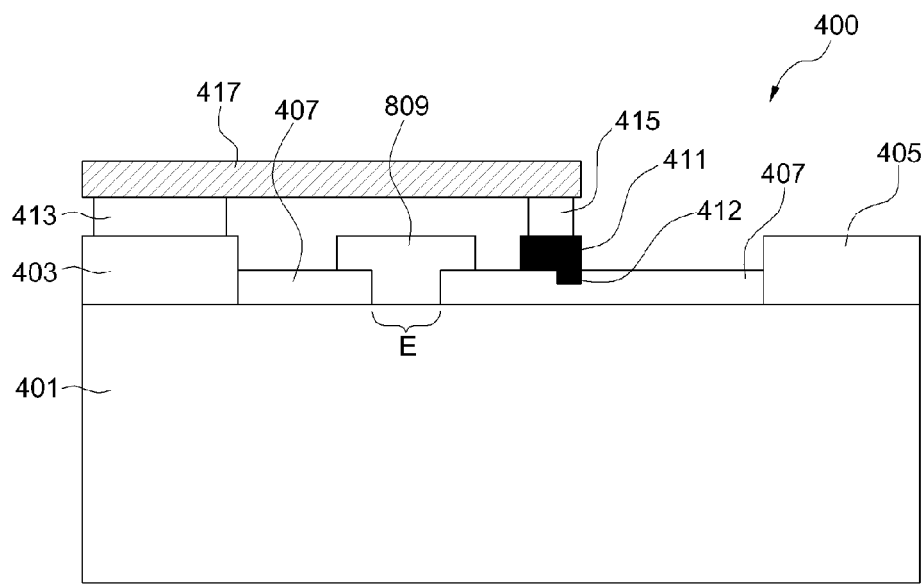
FIG. 8 is identical to FIG. 4A except that the gate electrode 809 has a T shape.

FIGS. 5 and 6 are diagrams for describing a reduction effect of an electric field concentration phenomenon according to the present disclosure.

Figure 1A:
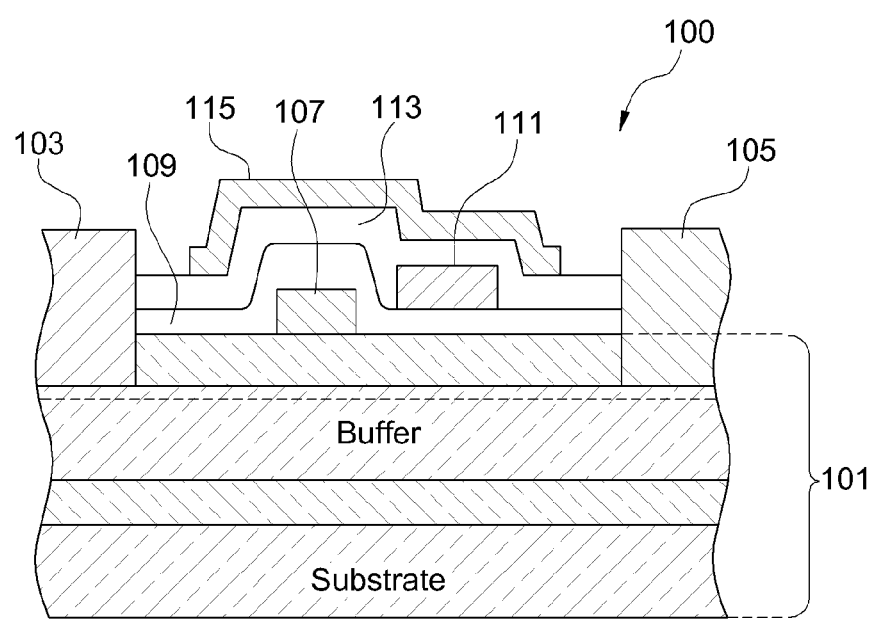
FIGS. 1A and 1B illustrate an example of a GaN power semiconductor device in the related art.
Figure 1B:
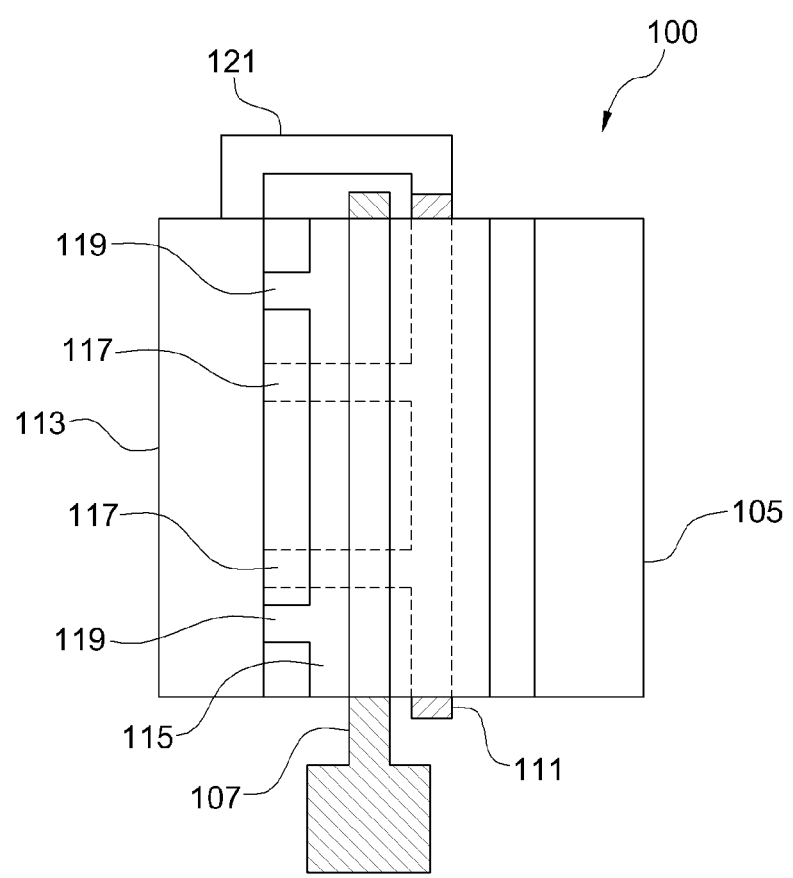
Figure 2:
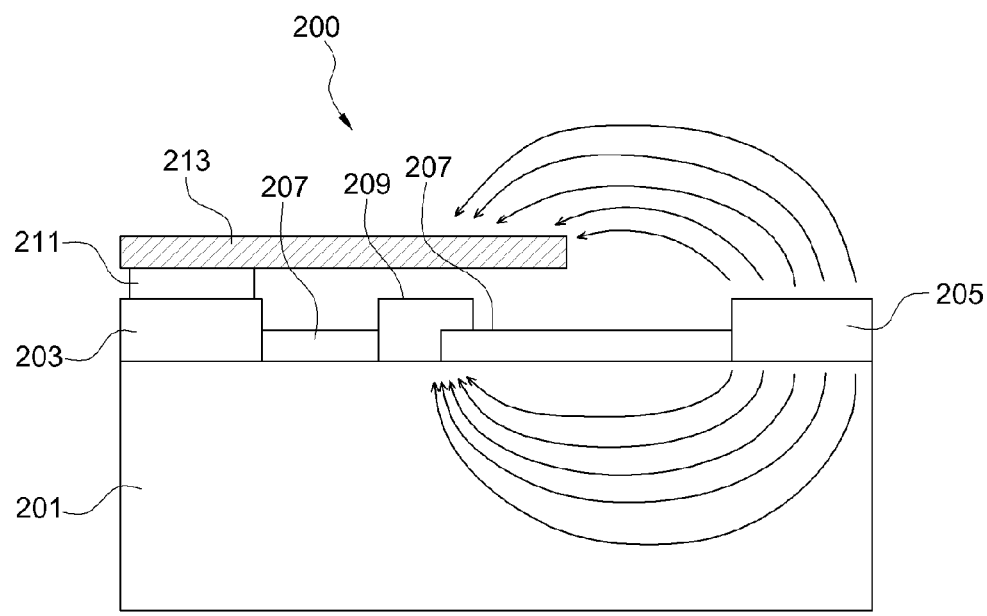
FIG. 2 illustrates another example of a GaN power semiconductor device in the related art.

FIG. 5 shows the intensity of the electric field formed between the drain electrode 305 and the gate electrode 309 in the power semiconductor device 300 according to the first exemplary embodiment of the present disclosure. As shown in FIG. 5, a part of the electric field to be formed on the gate electrode 309 is formed on the field plate 311, so that the intensity of the electric field between the drain electrode 305 and the gate electrode 309 is reduced, and thus an effect of improving the breakdown voltage of the power semiconductor device 300 may be obtained. Further, since the first exemplary embodiment of the present disclosure has a structure capable of reducing a gate-source capacitance in comparison with the structure (see FIG. 2) in the related art in which the source connection type field plate is on the gate electrode 309, an effect of improving an available operation frequency may be obtained.

FIG. 6 shows the intensity of the electric field formed between the drain electrode 405 and the gate electrode 409 in the power semiconductor device 400 according to the second exemplary embodiment of the present disclosure. Since the second field plate 417 is formed on the gate electrode 409, an available operation frequency has an almost similar structure to the structure (see FIG. 2) in the related art, but an effect of further reducing the intensity of the electric field between the drain electrode 405 and the gate electrode 409 may be obtained by forming many parts of the electric field to be formed on the gate electrode 409 on the first and second field plates 411 and 417 as shown in FIG. 6. Accordingly, the effect of improving the breakdown voltage of the power semiconductor device 400 becomes larger.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A power semiconductor device, comprising:
    a source electrode and a drain electrode formed on a substrate;
    a dielectric layer formed between the source electrode and the drain electrode to have a lower height than heights of the two electrodes and including an etched part exposing the substrate;
    a gate electrode formed on the etched part;
    a field plate formed on the dielectric layer between the gate electrode and the drain electrode, wherein the dielectric layer includes an upper surface in direct contact with both of the gate electrode and the field plate; and
    a metal configured to connect the field plate and the source electrode.

2. The power semiconductor device of claim 1, wherein the metal is formed on an equal plane on which the field plate is formed.

3. The power semiconductor device of claim 2, wherein the metal is formed in a curve shape.

4. The power semiconductor device of claim 1, wherein the gate electrode is a gamma (Γ) shaped gate electrode or a T shaped gate electrode.

5. The power semiconductor device of claim 1, wherein corner parts of the source electrode, the drain electrode, the gate electrode and the field plate are formed in a curve shape.

6. The power semiconductor device of claim 1, further comprising a further field plate formed below the field plate through a fine etching process of the dielectric layer.

7. A power semiconductor device, comprising:
- a source electrode and a drain electrode formed on a substrate;
- a dielectric layer formed between the source electrode and the drain electrode to have a lower height than heights of the two electrodes and including an etched part exposing the substrate;
- a gate electrode formed on the etched part;
- a first field plate formed on the dielectric layer between the gate electrode and the drain electrode, wherein the dielectric layer includes an upper surface in direct contact with both of the gate electrode and the first field plate;
- a second field plate spaced from the gate electrode and formed over an area from the source electrode to the first field plate; and
- a metal configured to connect the source electrode and the second field plate, and the first field plate and the second field plate, respectively.

8. The power semiconductor device of claim 7, wherein the gate electrode is a gamma (Γ) shaped gate electrode or a T shaped gate electrode.

9. The power semiconductor device of claim 7, wherein corner parts of the source electrode, the drain electrode, the gate electrode, the first field plate and the second field plate are formed in a curve shape.

10. The power semiconductor device of claim 7, further comprising a further field plate formed on a lower part of the first field plate through a fine etching process of the dielectric layer.

\* \* \* \* \*